(12) United States Patent
Nakagawa et al.

(10) Patent No.: US 10,105,892 B2
(45) Date of Patent: Oct. 23, 2018

(54) IMPRINT APPARATUS AND IMPRINT METHOD, AND ARTICLE MANUFACTURING METHOD

(71) Applicant: CANON KABUSHIKI KAISHA, Tokyo (JP)

(72) Inventors: Kazuki Nakagawa, Utsunomiya (JP); Keiji Emoto, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 851 days.

(21) Appl. No.: 14/376,334

(22) PCT Filed: Feb. 26, 2013

(86) PCT No.: PCT/JP2013/001092
§ 371 (c)(1),
(2) Date: Aug. 1, 2014

(87) PCT Pub. No.: WO2013/128888
PCT Pub. Date: Sep. 6, 2013

(65) Prior Publication Data
US 2015/0042012 A1    Feb. 12, 2015

(30) Foreign Application Priority Data

Feb. 27, 2012 (JP) ................ 2012-039813

(51) Int. Cl.
*B29C 59/02* (2006.01)
*G03F 7/00* (2006.01)
(Continued)

(52) U.S. Cl.
CPC ............ *B29C 59/026* (2013.01); *B82Y 10/00* (2013.01); *B82Y 40/00* (2013.01); *G03F 7/0002* (2013.01);
(Continued)

(58) Field of Classification Search
CPC ....... B29C 59/026; B82Y 40/00; B82Y 10/00; G03F 7/0002; B29D 2009/00; B29L 2009/00; B29K 2101/00
See application file for complete search history.

(56) References Cited

U.S. PATENT DOCUMENTS

| 9,122,149 B2 | 9/2015 | Sato et al. |
| 2011/0140304 A1 | 6/2011 | Choi et al. |

(Continued)

FOREIGN PATENT DOCUMENTS

| CN | 102162992 A | 8/2011 |
| CN | 102200687 A | 9/2011 |

(Continued)

OTHER PUBLICATIONS

Korean Office Action issued in counterpart application No. KR10-2014-7023122, dated Nov. 26, 2015. English translation provided.

(Continued)

*Primary Examiner* — Robert J Grun
(74) *Attorney, Agent, or Firm* — Rossi, Kimms & McDowell LLP

(57) ABSTRACT

An imprint apparatus is provided with: an application unit; a substrate holding unit including an auxiliary plate; a gas supply unit including multiple supply outlets, which supplies gas to an interstice between a mold and a substrate, in conjunction with movement of a shot region by driving of the substrate holding unit from an application position of the application unit to a pressing position where pressing is conducted, when pressing the mold against an uncured resin applied to the shot region; and a controller which selects a supply outlet to supply the gas so that the supply outlet that supplies the gas among the multiple supply outlets is opposed by either the substrate or the auxiliary plate, while the shot region to which the uncured resin was applied is moved toward the pressing position, and which controls a direction of movement of the shot region.

11 Claims, 10 Drawing Sheets

(51) Int. Cl.
*B82Y 10/00* (2011.01)
*B82Y 40/00* (2011.01)
*B29K 101/00* (2006.01)
*B29L 9/00* (2006.01)

(52) U.S. Cl.
CPC ...... *B29D 2009/00* (2013.01); *B29K 2101/00* (2013.01); *B29L 2009/00* (2013.01)

(56) References Cited

U.S. PATENT DOCUMENTS

| | | |
|---|---|---|
| 2011/0206852 A1 | 8/2011 | Shiode |
| 2011/0273684 A1 | 11/2011 | Owa et al. |
| 2011/0290136 A1 | 12/2011 | Koga |
| 2011/0309548 A1 | 12/2011 | Aihara |

FOREIGN PATENT DOCUMENTS

| | | |
|---|---|---|
| JP | 2011-514658 A | 5/2011 |
| JP | 2011-253839 A | 12/2011 |
| JP | 2012039057 A | 2/2012 |
| KR | 20110107288 A | 9/2011 |
| KR | 20110137731 A | 12/2011 |
| WO | 2009/099630 A1 | 8/2009 |
| WO | 2009/153925 A1 | 12/2009 |
| WO | 2011/072202 A1 | 6/2011 |

OTHER PUBLICATIONS

Chinese Office Action issued in counterpart application No. 201380010484.1, dated Dec. 29, 2015. English translation provided.

International Search Report issued in PCT/JP2013/001092 dated May 14, 2013.

[Fig. 1]
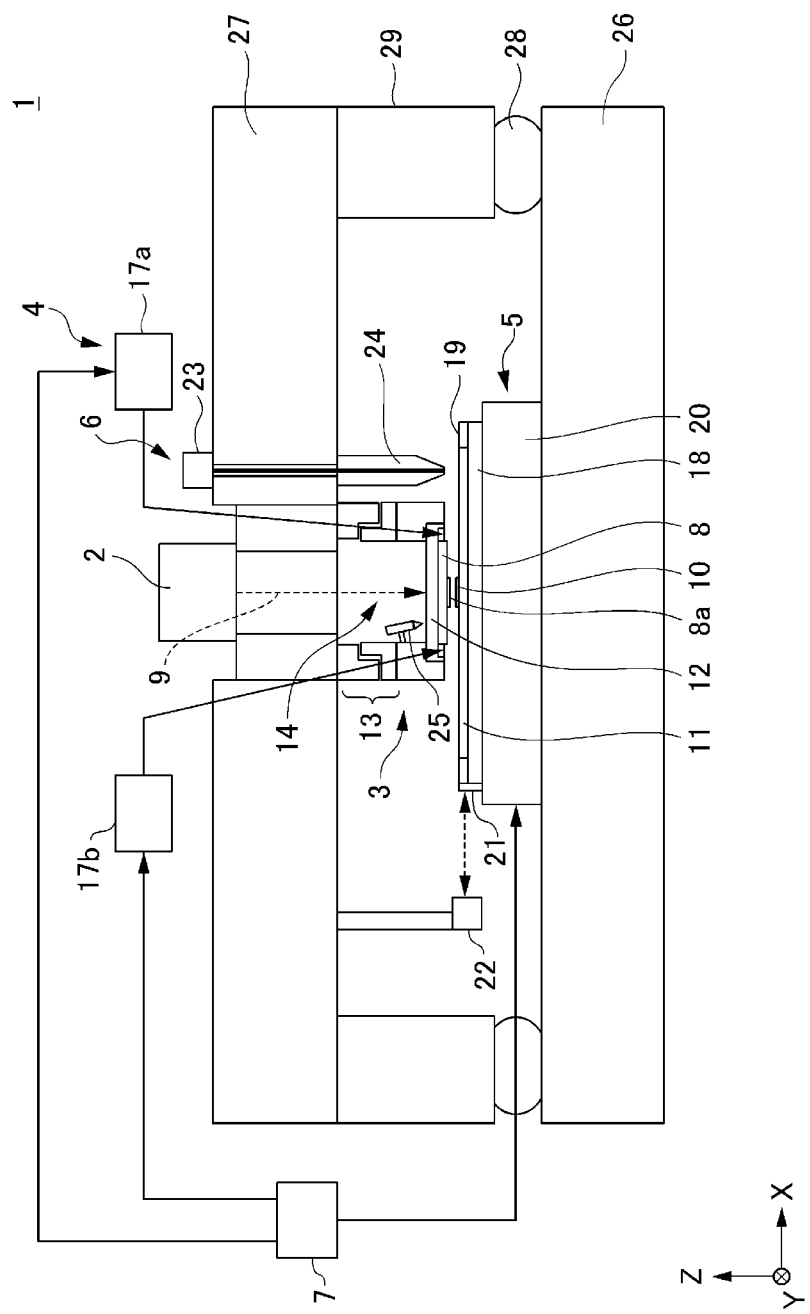

[Fig. 2]
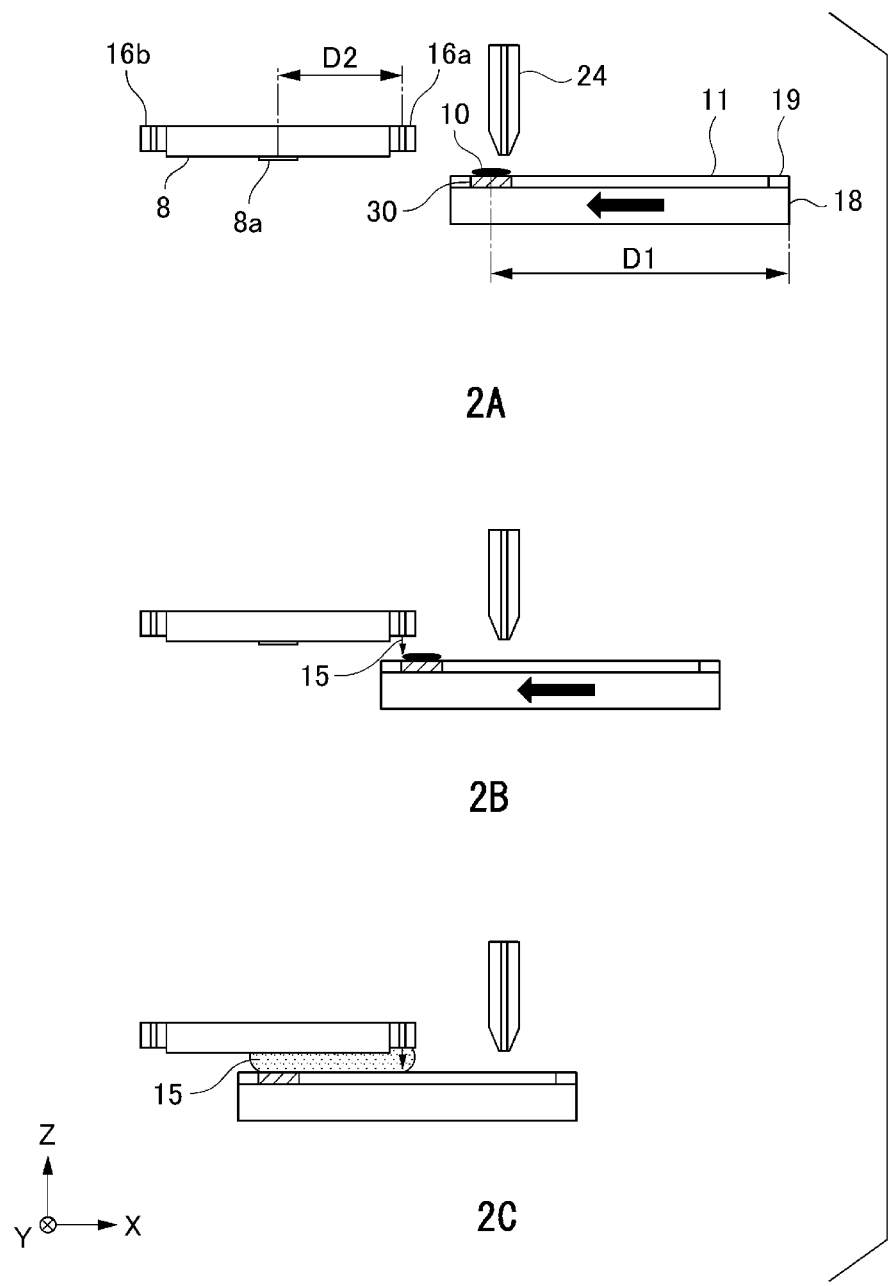

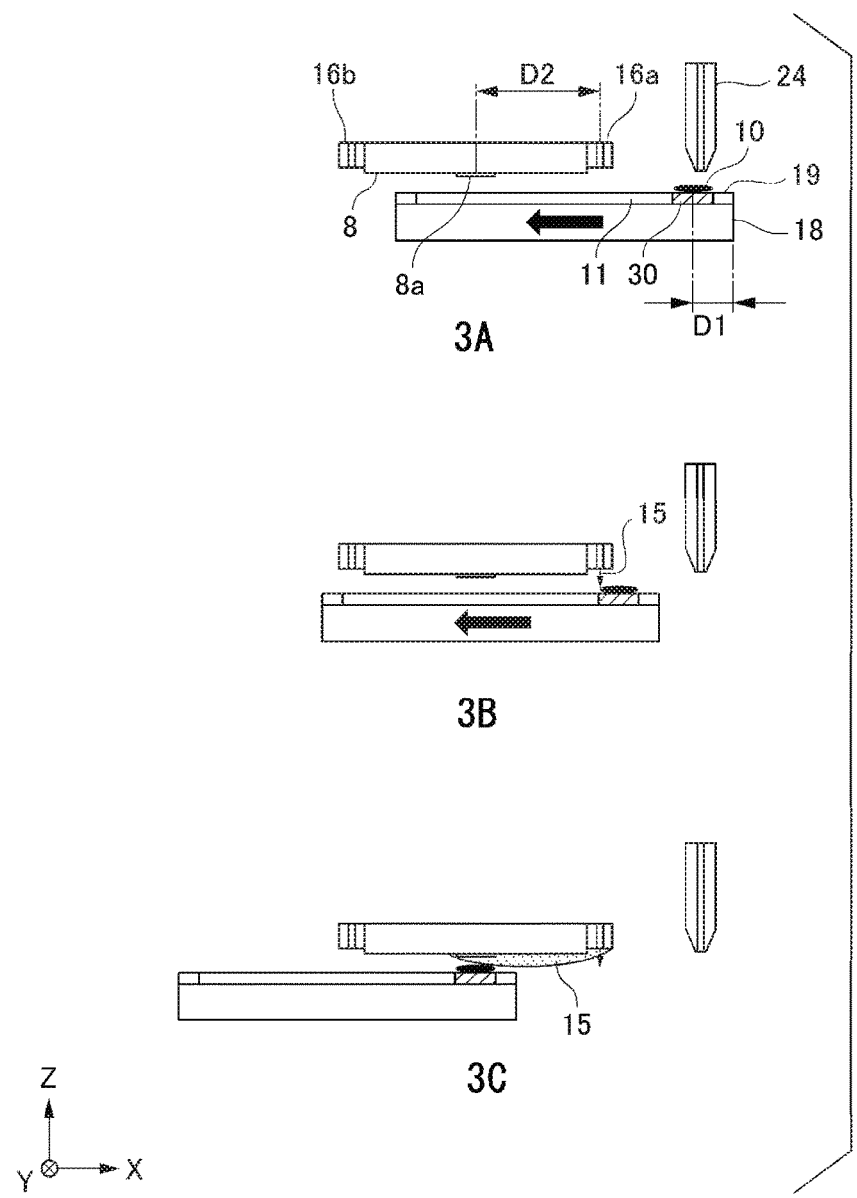
[Fig. 3]
(PRIOR ART)

[Fig. 4]
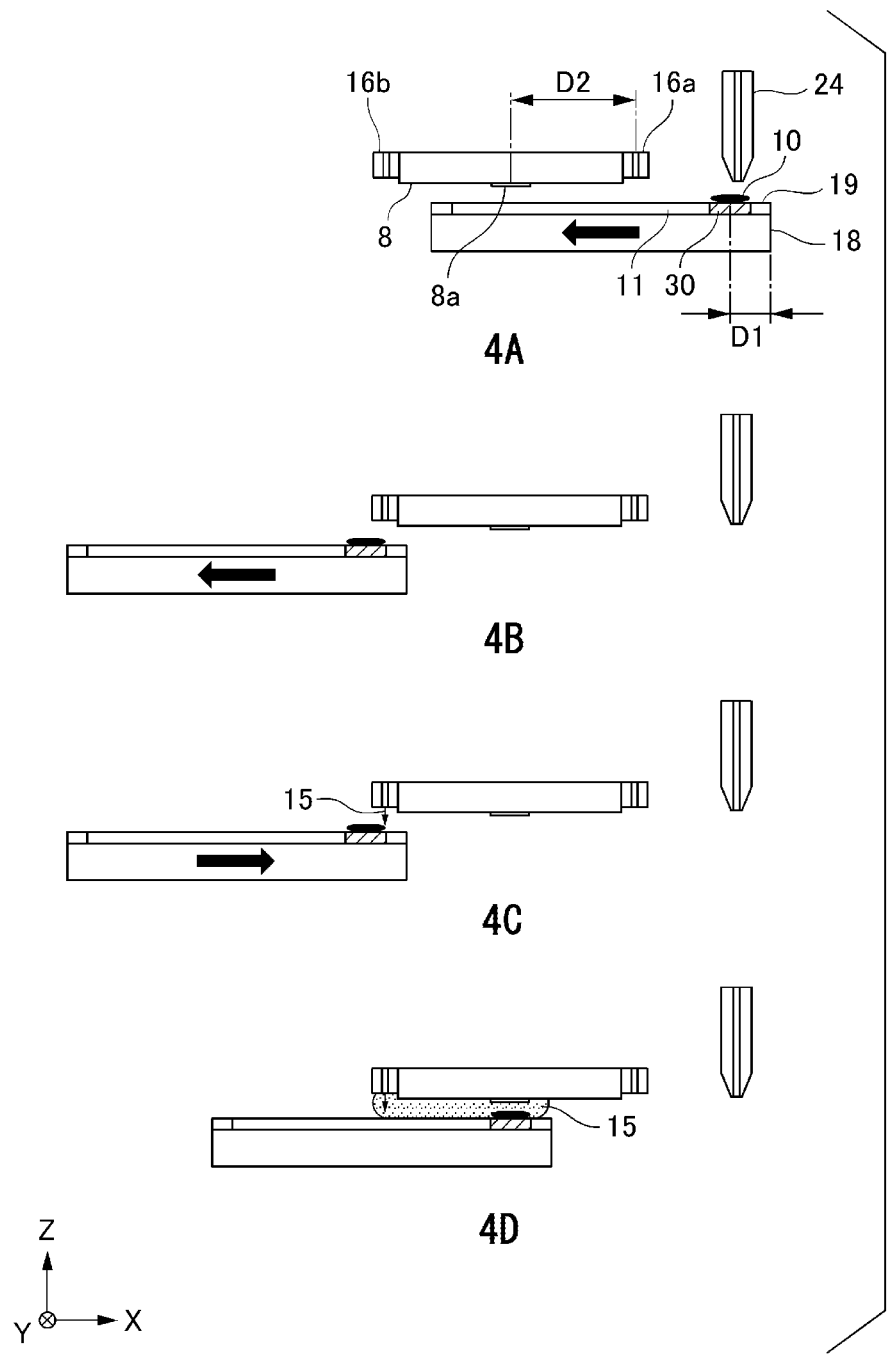

[Fig. 5]
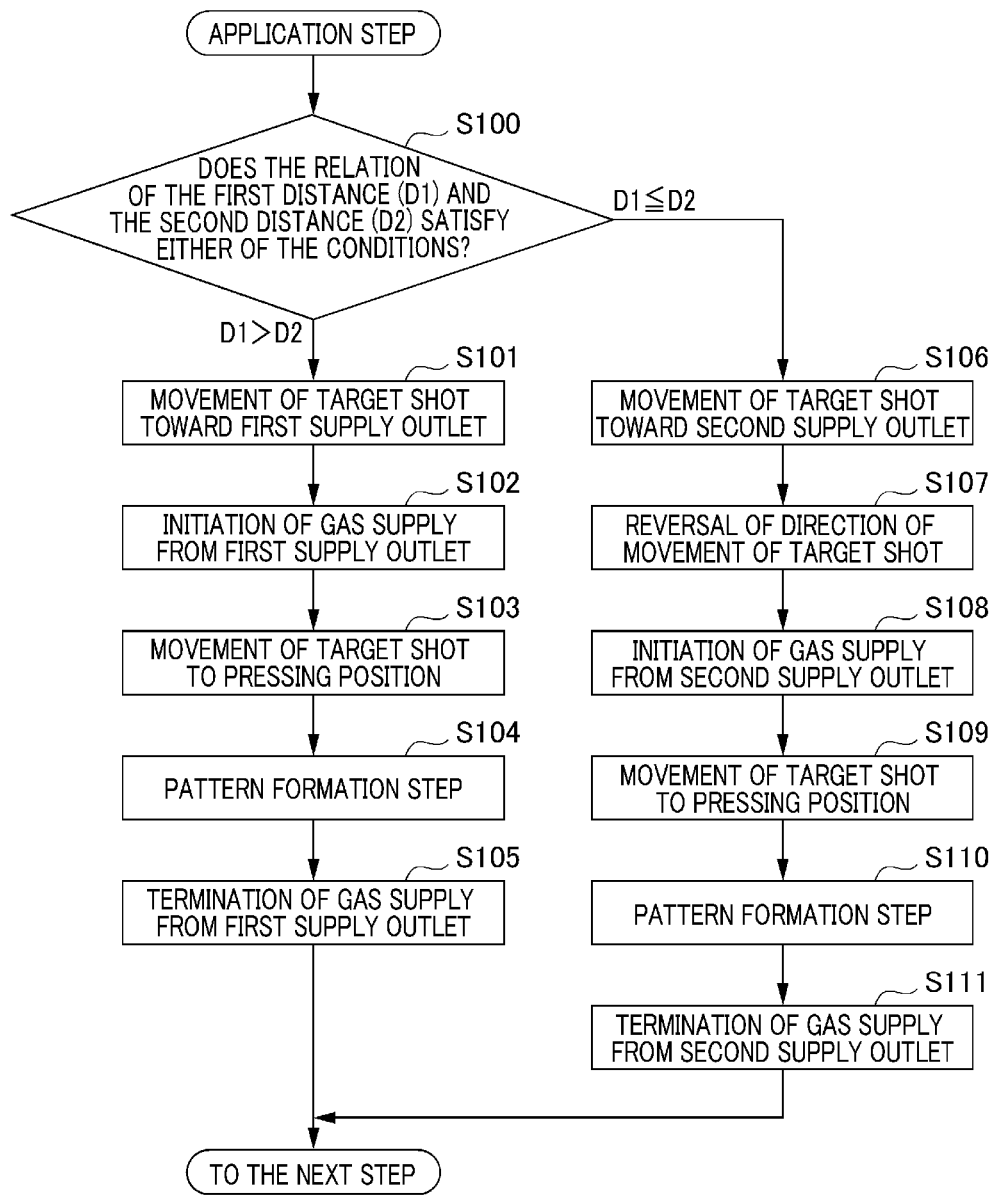

[Fig. 6]
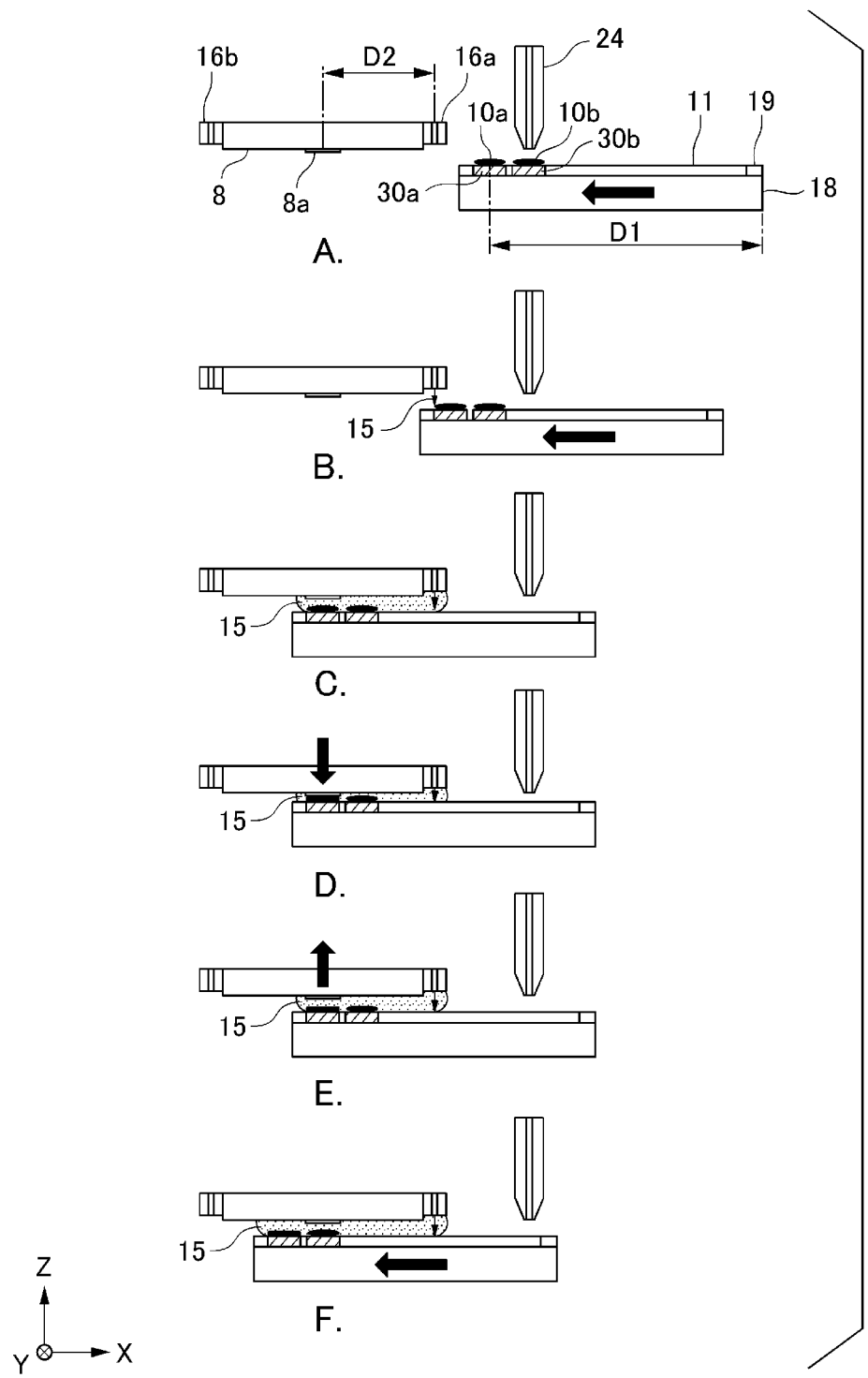

[Fig. 7]
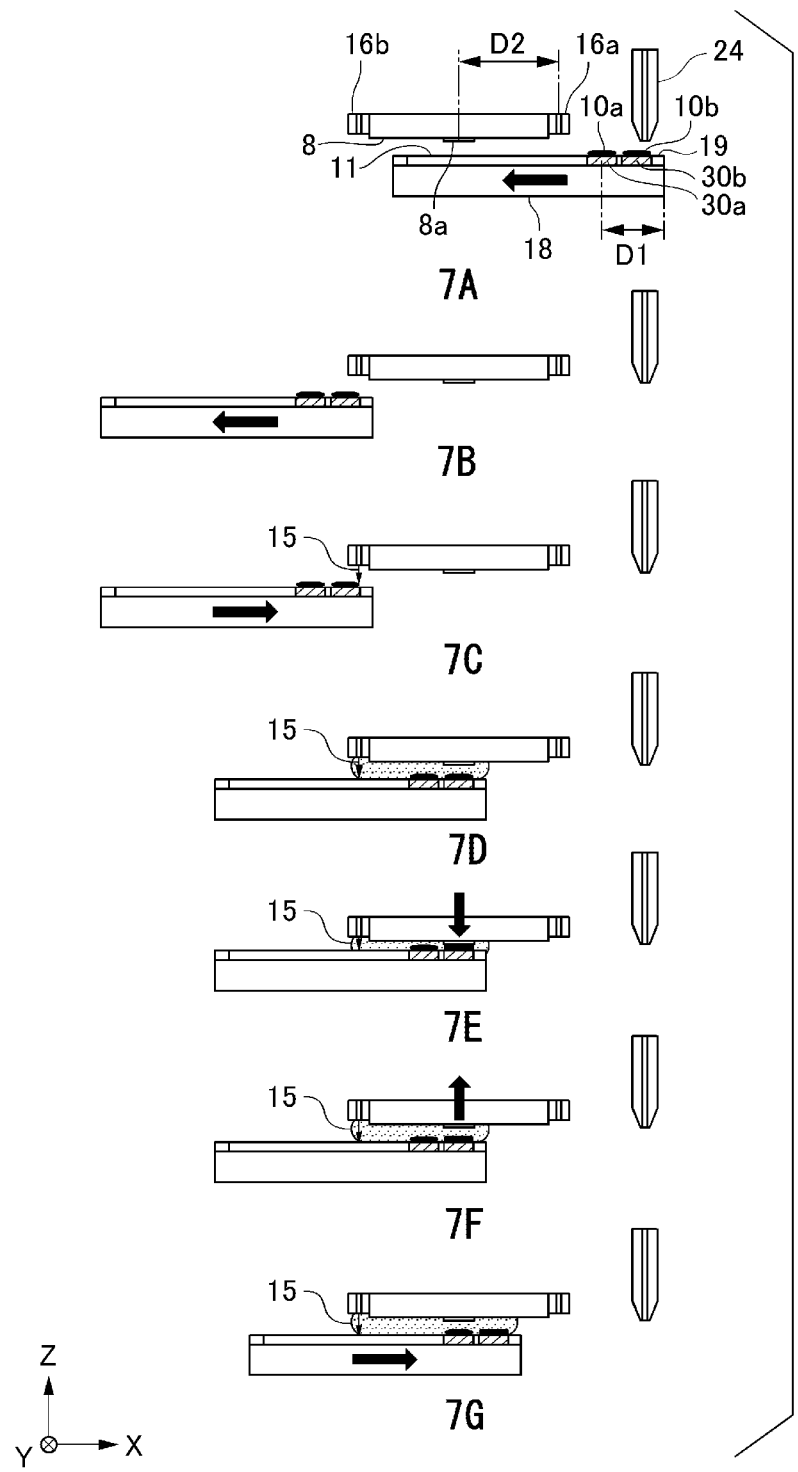

[Fig. 8]
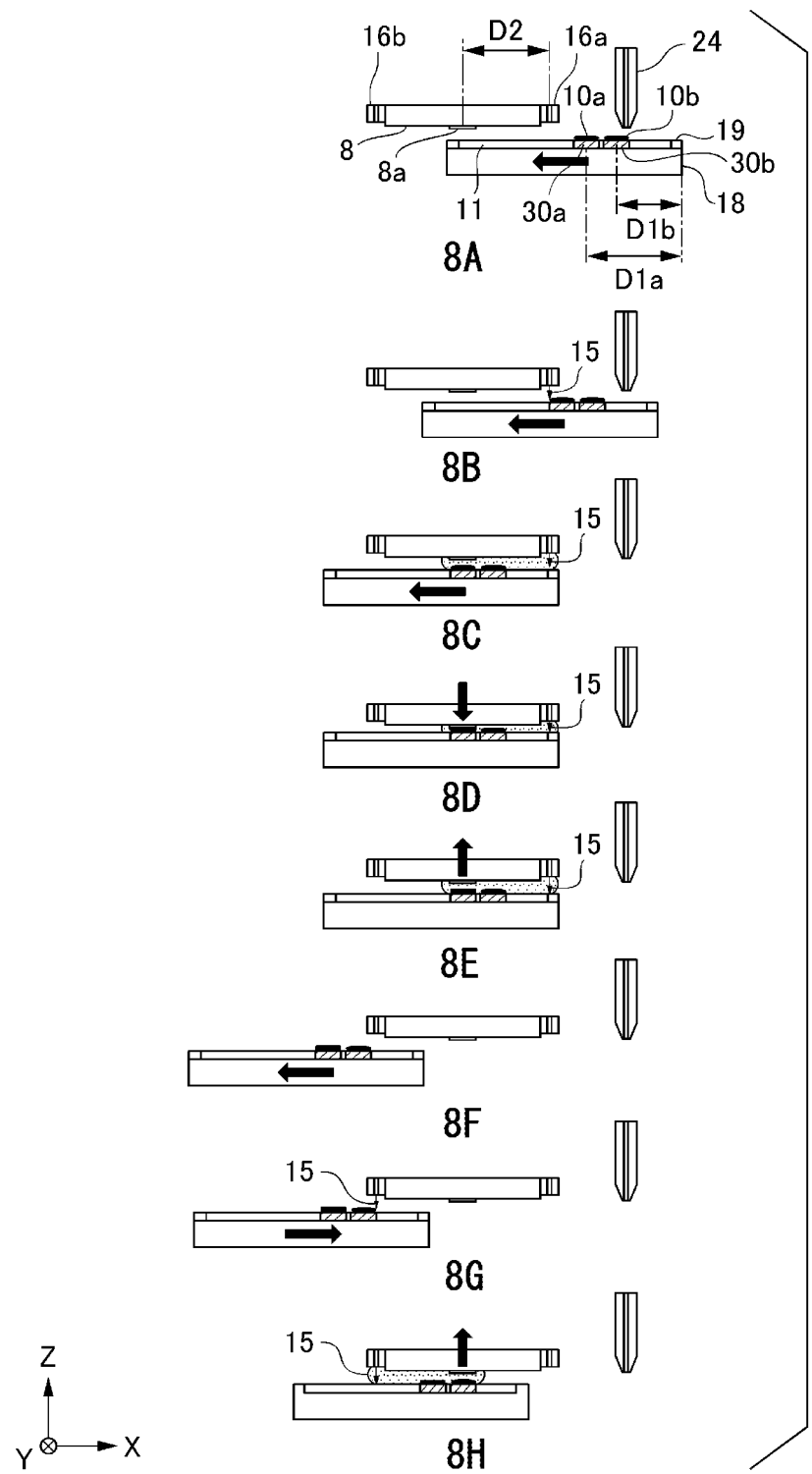

[Fig. 9]
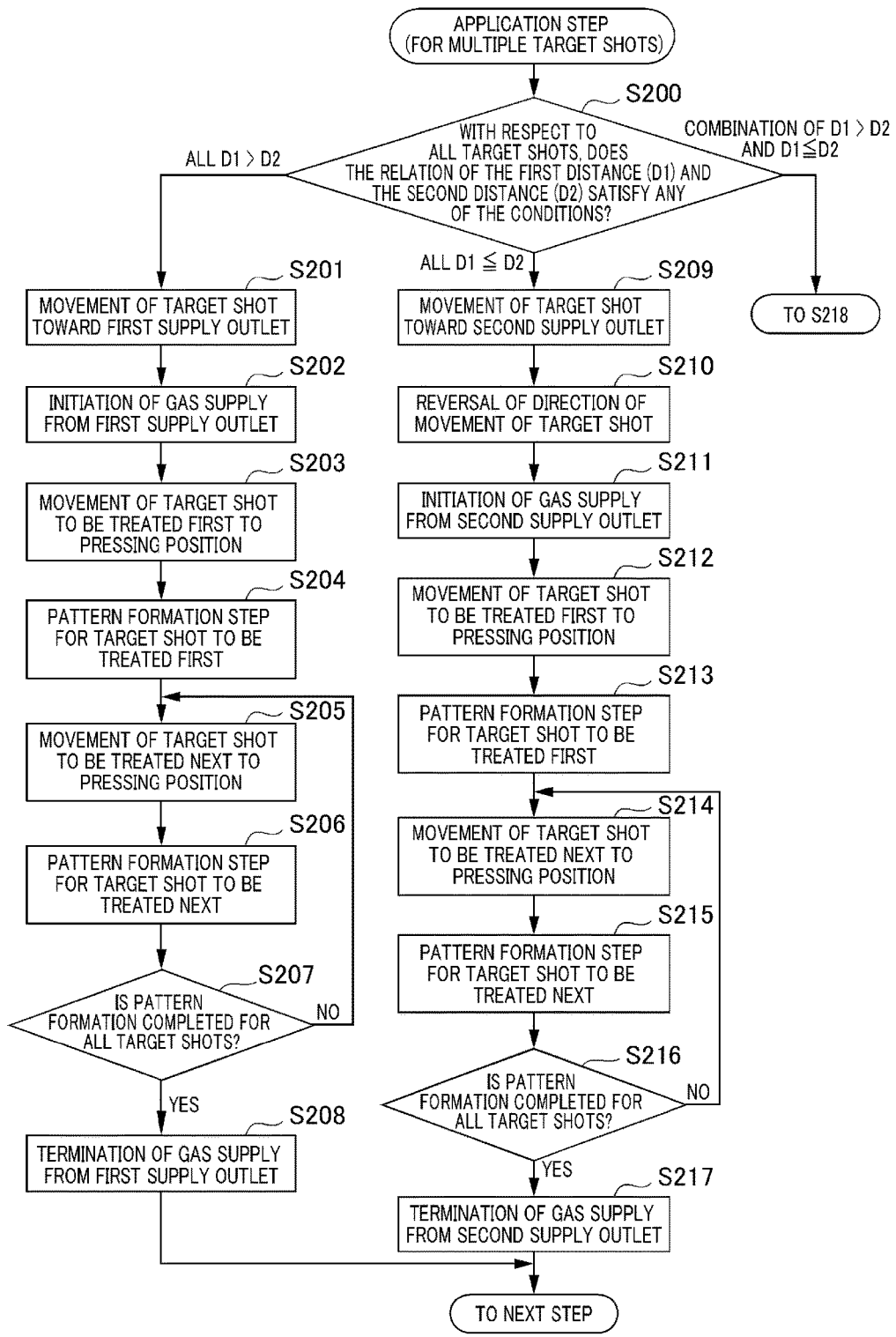

[Fig. 10]
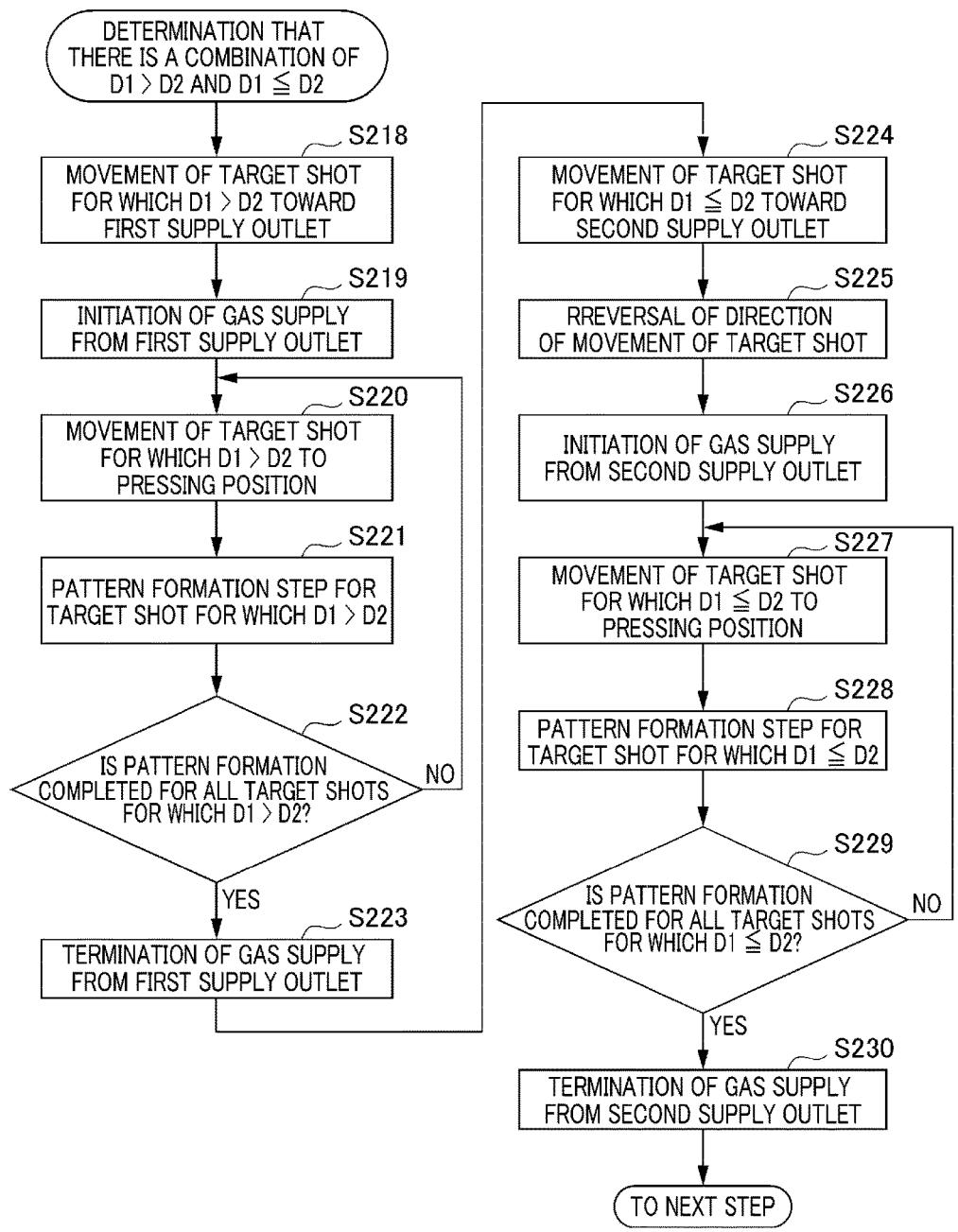

IMPRINT APPARATUS AND IMPRINT METHOD, AND ARTICLE MANUFACTURING METHOD

TECHNICAL FIELD

The present invention relates to an imprint apparatus, imprint method and an article manufacturing method using the same.

BACKGROUND ART

As the demand for microfabrication of semiconductor devices or MEMS increases, not only a conventional photolithography technology but also a microfabrication technology in which an uncured resin on a substrate is molded by a mold to thereby form a resin pattern on the substrate have been receiving attention. This technology is also referred to as an 'imprint technology', by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a shot (imprint region) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

With this type of imprint apparatus, when the resin fills the fine contoured pattern formed by the mold during pressing of the mold against the resin on the substrate, it sometimes happens that the resin pattern is not properly formed due to occurrence of unfilled portions stemming from residual air bubbles. Conventionally, imprint apparatuses have been proposed in which the interstice between the mold and the substrate during pressing is filled with a special gas to inhibit residual air bubbles. Patent Literature 1 discloses an imprint lithography method including a step in which a highly soluble or diffusible gas is conveyed to a position on a substrate near a viscous liquid (resin).

CITATION LIST

Patent Literature

[Patent Literature 1] Japanese Patent Laid-Open No. 2011-514658

In this situation, in order to obtain an effect where an interstice between a mold and a substrate is filled with a special gas to inhibit residual air bubbles as shown in Patent Literature 1, it is necessary to maintain gas concentration within the interstice at a rather high value. In order to raise this interstitial gas concentration in a particularly short time, there exists a conventional method in which gas is drawn into the interstice by simultaneously supplying gas when a substrate is moved (scanned) relative to a mold. At this time, a supply outlet which supplies gas toward the substrate is positioned either above the substrate surface, or above the surface near a peripheral edge of the substrate in a substrate stage (substrate holding unit). For purposes of efficient gas intake, it is preferable to align the height of the substrate surface with that of the surface near the peripheral edge. Consequently, it is common to install an auxiliary plate on the surface near the peripheral edge on the substrate stage to align it with the height of the substrate surface. However, the surface area of the installed auxiliary plate is preferably as small as possible in order to avoid enlargement of the substrate stage, but depending on the position of the shot on the substrate, a condition may arise in which the auxiliary plate is not positioned under the supply outlet during supply of the gas. When such a state occurs in which there is neither a substrate surface nor an auxiliary plate surface under a supply outlet, it is difficult to efficiently draw gas into the interstice.

SUMMARY OF INVENTION

The present invention provides an imprint apparatus which is advantageous for increasing efficiency when inhibiting the occurrence of unfilled portions in a contoured pattern of a mold, and which also prevents enlargement of a substrate stage on which a substrate is mounted.

The present invention is an imprint apparatus which molds and cures an uncured resin on a substrate with a mold, and which forms a cured resin pattern on the substrate, including: an application unit which applies uncured resin to a shot region on the substrate; a substrate holding unit which holds and moves the substrate, and which includes an auxiliary plate disposed at the periphery of the substrate so that surface height is aligned with that of the substrate; a gas supply unit including multiple supply outlets, which supplies gas to an interstice between the mold and the substrate, in conjunction with movement of the shot region by the driving of the substrate holding unit from an application position of the application unit to a pressing position where pressing is conducted, when pressing the mold against the uncured resin applied to the shot region; and a controller which selects a supply outlet to supply the gas so that the supply outlet that supplies the gas among the multiple supply outlets is opposed by either the substrate or the auxiliary plate, while the shot region to which the uncured resin has been applied is moved toward the pressing position, and which controls a direction of movement of the shot region.

According to the present invention, for example, it is possible to provide an imprint apparatus which is advantageous for increasing efficiency when inhibiting the occurrence of unfilled portions in a contoured pattern of a mold, and which also prevents enlargement of a substrate stage on which a substrate is mounted.

Further features of the present invention will become apparent from the following description of exemplary embodiments (with reference to the attached drawings).

BRIEF DESCRIPTION OF DRAWINGS

FIG. 1 is a diagram illustrating the configuration of the imprint apparatus according to a first embodiment of the present invention.

FIGS. 2A to 2C are diagrams illustrating operations in the case where a condition of D1 >D2 is satisfied in the first embodiment.

FIGS. 3A to 3C are diagrams illustrating operations in the case where a condition of D1 <=D2 is satisfied in prior art.

FIGS. 4A to 4D are diagrams illustrating operations in the case where a condition of D1 <=D2 is satisfied in the first embodiment.

FIG. 5 is a flow chart illustrating the sequence of gas supply steps according to the first embodiment.

FIGS. 6A to 6F are diagrams illustrating operations in the case where a condition of D1>D2 is satisfied in a second embodiment.

FIGS. 7A to 7G are diagrams illustrating operations in the case where a condition of D1 <=D2 is satisfied in the second embodiment.

FIGS. 8A to 8H are diagrams illustrating operations in the case where the respective conditions exist in combination in the second embodiment.

FIG. 9 is a flow chart illustrating the sequence of gas supply steps according to the second embodiment.

FIG. 10 is a flow chart illustrating the sequence of gas supply steps according to the second embodiment.

DESCRIPTION OF EMBODIMENTS

Hereinafter, preferred embodiments of the present invention will be described with reference to the drawings.
(First Embodiment)

Firstly, a description will be given of an imprint apparatus of a first embodiment of the present invention. FIG. 1 is a schematic diagram illustrating the configuration of an imprint apparatus 1 of the present embodiment. The imprint apparatus 1 is an apparatus that molds an uncured resin on a wafer (on a substrate), i.e., a substrate to be treated, using a mold to thereby form a resin pattern on the wafer, which is used in the manufacture of devices such as semiconductor devices and the like as articles. Note that the imprint apparatus of the present embodiment is an apparatus employing a photo-curing method. In the following drawings, a description will be given where the Z axis is aligned parallel to the optical axis of an irradiation system that irradiates a resin on a wafer with ultraviolet light, and mutually orthogonal axes X and Y are aligned in a plane perpendicular to the Z axis. Firstly, the imprint apparatus 1 includes a light irradiation unit 2, a mold holding mechanism 3, a gas supply mechanism 4, a wafer stage 5, an application unit 6, and a controller 7.

The light irradiation unit 2 irradiates a mold 8 with ultraviolet light 9 during imprint processing. Although its components are not illustrated in the drawing, the light irradiation unit 2 includes a light source, and an illumination optical system which adjusts the ultraviolet light 9 emitted from the light source to light that is appropriate for imprinting, and which irradiates the mold 8. There are no particular limitations on the light source, provided that a lamp such as a mercury lamp may be adopted, and that it emits light at a wavelength that cures a below-described resin (ultraviolet-curing resin) 10 by passing through the mold 8. The illumination optical system may include a lens, a mirror, an aperture, or a shutter or the like for switching between irradiation and light shielding. Note that, in the present embodiment, the light irradiation unit 2 is installed for employing the photo-curing method. If a thermosetting method is employed, a heating source unit for curing a thermosetting resin may be installed instead of the light irradiation unit 2.

The mold 8 has a circumferential form that is polygonal (ideally, rectangular or square), and the surface facing a wafer 11 contains a pattern section 8a in which a contoured pattern to be transferred, for example, to a circuit pattern or the like is three-dimensionally formed. Note that the pattern size will vary depending on the article to be manufactured, but also includes fine patterns of more than 10 nanometers. As the material of the mold 8 is capable of transmitting the ultraviolet light 9, and as it preferably has a low coefficient of thermal expansion, quartz may be used, for example. Furthermore, the surface of the mold 8 that is irradiated with the ultraviolet light 9 may also have a planar shape that is circular, and a cavity with a certain degree of depth.

The mold holding mechanism 3 has a mold chuck 12 which holds the mold 8, a mold drive mechanism 13 which movably holds the mold chuck 12, and a magnification correction mechanism (not shown) which corrects the form of the mold 8 (pattern section 8a). The mold chuck 12 is capable of holding the mold 8 by suctioning/attracting the peripheral region of the surface of the mold 8 that is irradiated with the ultraviolet light 9 using a vacuum suction force/an electrostatic attraction force. In the case where, for example, the mold 8 is held by vacuum suction force, the mold chuck 12 is connected to a vacuum pump (not shown) that is set up outside the apparatus, and the suction force (holding force) against the mold 8 can be adjusted by suitably adjusting suction pressure by the evacuation of the vacuum pump. The mold drive mechanism 13 moves the mold 8 in the respective axial directions so that pressing of the mold 8 against the wafer 11 or separation of the mold 8 therefrom is selectively conducted. As a power source that can be employed for the mold drive mechanism 13, there is, for example, a linear motor or an air cylinder. The mold drive mechanism 13 may be composed from a plurality of drive systems such as a course motion drive system and a micromotion drive system in order to satisfy highly precise positioning of the mold 8. Furthermore, the mold drive mechanism 13 may also have a configuration in which there are position adjustment functions not only in the Z axis direction, but also in the X axis direction or Y axis direction or a theta (rotation around the Z axis) direction, a tilt function that serves to correct an inclination of the mold 8, and so on. Note that the respective operations which conduct pressing and separation in the imprint apparatus 1 may be accomplished by moving the mold 8 in the Z axis direction, but it may also be accomplished by moving the wafer stage 5 in the Z axis direction, or by conducting relative movement of these two. The position of the mold 8 at the time of driving by the mold drive mechanism 13 can be measured by a position measurement unit such as an optical displacement meter (not shown) that measures the distance between the mold 8 and the wafer 11. The magnification correction mechanism is set up on the holding side of the mold 8 in the mold chuck 12, and corrects the form of the mold 8 (pattern section 8a) by mechanically applying external force or displacement to the side face of the mold 8. Furthermore, the mold chuck 12 and the mold drive mechanism 13 have an aperture region 14 in the central area in the planar direction (inner side) through which the ultraviolet light 9 emitted from the light irradiation unit 2 can pass en route to the wafer 11.

The gas supply mechanism (gas supply unit) 4 supplies gas to an interstice between the mold 8 and the wafer 11 during a pressing operation. This is in order to achieve enhancement of filling properties by shortening the time for filling of the contoured pattern of the pattern section 8a by the resin 10, and by inhibiting air bubbles from remaining in the filled portions. The gas supply mechanism 4 similarly supplies gas during separating operation, as well, in order to achieve enhancement of mold release properties that minimizes separation force. The gas supply mechanism 4 is installed near the four side faces of the mold 8, and is provided with multiple supply outlets 16 (see FIG. 2A) which supply (discharge) a gas 15 toward the wafer stage 5 side, and gas controllers 17 which are connected to the respective supply outlets 16, and which adjust the supply amount and concentration of the gas 15. In particular, the gas supply mechanism 4 of the present embodiment is provided with two supply outlets 16 which are a first supply outlet 16a and a second supply outlet 16b that are respectively set up near the two side faces in the X axis direction of the mold 8. Among these, the first supply outlet 16a is connected to a first gas controller 17a, while the second supply outlet 16b is connected to a second gas controller 17b, and the gas controllers 17a and 17b are respectively connected to the controller 7. In this context, from the standpoint of the aforementioned filling properties and mold release properties, a gas with excellent solubility and diffusability in the resin 10—e.g., helium, carbon dioxide, nitrogen, hydrogen, xenon, condensable gas, or the like—may be preferably used as the gas 15.

The wafer 11 is, for example, a single-crystal silicon substrate, an SOI (Silicon on Insulator) substrate, or a glass substrate. Patterns (a layer containing patterns) of the resin 10 are respectively formed by the pattern section 8a in multiple shot regions which are the pattern formation regions on the wafer 11.

The wafer stage (substrate holding unit) 5 holds the wafer 11, is mobile, and conducts alignment or the like of, for example, the pattern section 8a and a shot region during pressing of the mold 8 and the resin 10 on the wafer 11. The wafer stage 5 has a wafer chuck 18 which holds the wafer 11 by suction force, an auxiliary plate (isofacial plate) 19 which is disposed so as to surround the periphery of the wafer 11, and a stage drive mechanism 20 which mechanically holds the wafer chuck 18, and which is movable in the respective axial directions. The wafer chuck 18 supports the rear surface of the wafer 11 with, for example, multiple pins of uniform height, and holds the wafer 11 by reducing pressure on the non-pin portions by vacuum evacuation. The auxiliary plate 19 has a surface height that aligns with that of the surface of the wafer 11 mounted on the wafer chuck 18, and is used to achieve a more uniform thickness of the resin patterns at the peripheral edge of the wafer 11. The stage drive mechanism 20 is a power source with little vibration during driving and while stationary, and, for example, a linear motor, planar motor or the like may be adopted as the power source. The stage drive mechanism 20 may also be configured from multiple drive systems such as a coarse motion drive system and a micromotion drive system for movement in the respective directions of the X axis and the Y axis. Furthermore, it may also be configured with a drive system for conducting position adjustment in the Z axis direction, or with a position adjustment function for the theta direction of the wafer 11, or a tilt function for correcting an inclination of the wafer 11, or the like. The wafer stage 5 is provided at its side faces with multiple reference mirrors 21 corresponding to the respective directions of X, Y, Z, omegax, omegay, and omegaz. In this regard, the imprint apparatus 1 is provided with multiple laser interferometers (position measurement mechanisms) 22 which measure the position of the wafer stage 5 by respectively irradiating these reference mirrors 21 with a beam of helium-neon or the like. FIG. 1 illustrates only one set of a reference mirror 21 and a laser interferometer 22. The laser interferometer 22 measures the position of the wafer stage 5 in real time, and the below-described controller 7 controls positioning of the wafer 11 (wafer stage 5) based on the measurement values obtained at this time. Otherwise, in addition to the aforementioned gauge interferometer, an encoder or the like using a semiconductor laser may be employed as the position measurement mechanism.

The application unit 6 is set up in the vicinity of the mold holding mechanism 3, and applies resin (uncured resin) 10 onto a shot region present on the wafer 11. The resin 10 is ultraviolet curable resin (photo-curable resin, imprint material) having the property of being cured by receiving irradiation of the ultraviolet light 9, and is appropriately selected depending on various conditions such as the manufacturing process of the semiconductor devices or the like. The application unit 6 adopts an inkjet system as the application system, and includes a container 23 for storing the resin 10 in an uncured state, and a droplet discharge unit 24. The container 23 enables conservation of the resin 10 with an interior provided with an atmosphere that does not engender a curing reaction of the resin 10—e.g., an atmosphere containing some oxygen—and its material is preferably such that particles or chemical impurities are not incorporated into the resin 10. The droplet discharge unit 24 contains, for example, a piezo-type discharge mechanism (inkjet head). The application unit 6 is capable of adjusting an application position, an application amount and the like based on operational commands from the controller 7.

The controller 7 may control the operation, adjustment, and the like of the components of the imprint apparatus 1. The controller 7 is constituted by a computer or the like and is connected to the components of the imprint apparatus 1 through a line so as to execute control of the components by a program or the like. The controller 7 of the present embodiment may control the operation of at least the gas supply mechanism 4 and the wafer stage 5. Note that the controller 7 may be integrated with the rest of the imprint apparatus 1 (provided in a common housing) or may be provided separately from the rest of the imprint apparatus 1 (provided in a separate housing).

In addition, the imprint apparatus 1 includes an alignment measurement system 25 which measures positional deviations in the X axis and Y axis directions of alignment marks formed on the wafer 11 and alignment marks formed on the mold 8. The imprint apparatus 1 also includes a base surface plate 26 which is mounted on the wafer stage 5, and which forms a reference plane, a bridge surface plate 27 which fixes the mold holding mechanism 3, and a strut 29 which extends from the base surface plate 26, and which supports the bridge surface plate 27 via a vibration elimination device 28 that eliminates vibration from the floor surface. Furthermore, the imprint apparatus 1 may also include a mold conveyance mechanism (not shown) for conveying the mold 8 between the exterior of the apparatus and the mold holding mechanism 3, and a substrate conveyance mechanism (not shown) for conveying the wafer 11 between the exterior of the apparatus and the wafer stage 5.

Next, a description will be given of the imprint processing (imprint method) performed by the imprint apparatus 1. Firstly, the controller 7 causes the substrate conveyance mechanism to mount and fix the wafer 11 on the wafer chuck 18. Next, the controller 7 causes the alignment measurement system 25 to detect the position of the wafer 11 to a high degree of accuracy by sequentially measuring the alignment marks on the wafer 11 while appropriately changing the position of the wafer 11 by the driving of the stage drive mechanism 20. The controller 7 then computes the respective transfer coordinates from the detection results. Consecutively, patterns are formed in the respectively particular shot regions based on these computation results. As to the process of pattern formation for a given shot region, the controller 7 first causes the stage drive mechanism 20 to position the application position on the wafer 11 (the particular position of the shot region) under the droplet discharge unit 24 of the application unit 6. Subsequently, the application unit 6 applies the resin 10 to the shot region on the wafer 11 (application step). Next, the controller 7 causes the stage drive mechanism 20 to move the wafer 11 so that the shot region is positioned at a pressing position directly underneath the pattern section 8a. Next, the controller 7 causes the position measurement mechanism to align the pattern section 8a and the shot region, after which the mold drive mechanism 13 is driven, and the pattern section 8a is pressed against the resin 10 on the shot region (mold-pressing step). As a result of this pressing, the resin 10 fills the contoured pattern of the pattern section 8a. The controller 7 judges the termination of pressing by a load sensor (not shown) that is set inside the mold holding mechanism 3. In this state, the light irradiation unit 2 emits the ultraviolet light 9 for a predetermined time from the rear surface (top surface) of the mold 8, and cures the resin 10 by the ultraviolet light 9 that pass through the mold 8 (curing step). After the resin 10 is cured, the controller 7 causes the mold drive mechanism 13 to drive again, and to separate the pattern section 8a from the wafer 11 (mold-releasing step). By this means, a three-dimensional resin pattern (layer) conforming to the contoured pattern of the pattern section 8a is formed on the surface of the shot region of the wafer 11. By carrying out this series of imprint operations multiple times while changing shot regions by driving the wafer stage 5, the imprint apparatus 1 can form multiple resin patterns on a single wafer 11.

In the foregoing pressing step, when the mold 8 is pressed against the resin 10 on the wafer 11, it is necessary that the resin 10 evenly fill the contoured pattern of the pattern section 8a. The reason for this is that when the resin 10 is cured in a state where air bubbles remain in the resin 10 that fills the interior of the contoured pattern, the resin pattern formed on the shot region loses the desired shape, thereby affecting the manufactured article itself such as a semiconductor device. During pressing (at least at the start of pressing), as described above, the gas 15 is supplied to the interstice between the mold 8 and the wafer 11 by the gas supply mechanism 4. As a result, residual air bubbles can be effectively inhibited, because gas concentration in the vicinity of the pattern section 8a becomes sufficiently high at, for example, 70% due to the diffusion effect of the gas 15 itself after a fixed period of time has elapsed. However, with this type of technique for inhibiting residual air bubbles by a gas filling method, it has previously been necessary to wait for a fixed period of time until the interstitial gas concentration between the mold 8 and the wafer 11 becomes sufficiently high. Although this waiting time varies depending on, for example, the peripheral configuration of the mold 8 and the required gas concentration, if one assumes a standard imprint apparatus, it is on the order of 1 second to several tens of seconds or more. Given that this waiting time can affect the productivity of the imprint apparatus, it is preferable to shorten it as much as possible. The imprint apparatus 1 of the present embodiment performs the following operations during supply of the gas 15 in order to rapidly raise interstitial gas concentration between the mold 8 and the wafer 11.

First, assuming the existence of a target shot region 30 constituting an imprint processing target of a given occasion on the wafer 11, the operations of the imprint apparatus 1 after application of the resin 10 onto this target shot region 30 (after the application step) are described in their respective chronological sequence using the drawings from FIGS. 2A to FIG. 4D. All of the respective drawings from FIGS. 2A to FIG. 4D are schematic cross-sectional diagrams which show driving operations of the wafer stage 5 and operations of the gas supply mechanism 4 to supply the gas 15 after application of the resin 10 to the target shot region 30, until the target shot region 30 has been moved to the pressing position directly underneath the pattern section 8a. In these drawings, with respect to the first supply outlet 16a and the second supply outlet 16b arranged in the X axis direction with interposition of the mold 8, the target shot region 30 is moved to the pressing position from the + side to the − side in the X axis direction after application of the resin 10. Of these drawings, FIGS. 2A to 2C are drawings which show operations in the case where the target shot region 30 is on the direction-of-movement side on the wafer 11 (the − side in the X axis direction). In this context, with respect to the direction of movement (the X axis direction) of the target shot region 30, a distance from the position of the target shot region 30 to the edge of the wafer 11 or auxiliary plate 19 on the + side in the X axis direction is considered as D1 (a first distance), and a distance from the pattern section 8a to the first supply outlet 16a is considered as D2 (a second distance). At this time, the operations shown in FIGS. 2A to 2C may be considered as operations for the case where the position of the target shot region 30 on the wafer 11 fulfills the condition that the first distance is larger than the second distance (D1>D2). First, as shown in FIG. 2A, the target shot region 30 to which the resin 10 was applied from the droplet discharge unit 24 is moved toward the first supply outlet 16a in immediate proximity to the droplet discharge unit 24 by the driving of the wafer stage 5. Next, as shown in FIG. 2B, the first gas controller 17a initiates supply of the gas 15 from the first supply outlet 16a when the target shot region 30 is positioned in the vicinity of the first supply outlet 16a, and the target shot region 30 is continuously moved to the pressing position. As shown in FIG. 2C, the gas 15 supplied from the first supply outlet 16a is drawn into the interstice between the mold 8 and the wafer 11 in conjunction with movement of the wafer 11, efficiently raising gas concentration particularly in the vicinity of the pattern section 8a. Otherwise, as interstitial gas concentration is maintained at a higher level when the interstice between the mold 8 and the wafer 11 is narrow, the interstice is preferably on the order of 0.1-1 mm Thus, if operations are conducted in the case where the aforementioned condition of D1>D2 is satisfied, the wafer 11 or the auxiliary plate 19 is in constant opposition directly underneath the first supply outlet 16a (in the supply position) during supply of the gas 15 while the target shot region 30 is being moved to the pressing position. Therefore, with the operations shown in FIGS. 2A to 2C, the interstice between the mold 8 and the wafer 11 is maintained from directly underneath the first supply outlet 16a until directly underneath the pressing position.

In contrast, as the reverse of the case of FIGS. 2A to 2C, the case is considered where the position of the target shot region 30 on the wafer 11 is on the downstream side of the direction of movement on the wafer 11 (the + side in the X axis direction). As a comparative mode corresponding to FIGS. 2A to 2C and the below-described FIGS. 4A to 4D, FIGS. 3A to 3C are drawings which show conventional operations in the case where the target shot region 30 is on the downstream side of the direction of movement on the wafer 11. The operations shown in these FIGS. 3A to 3C may be considered as operations for the case where the position of the target shot region 30 on the wafer 11 satisfies the condition that the first distance is less than or equal to the second distance (D1<=D2) when the respective distances D1 and D2 defined in the description of FIGS. 2A to 2C are used. In this case, as shown in FIG. 3A, the target shot region 30 to which the resin 10 has been applied from the droplet discharge unit 24 is also first moved toward the first supply outlet 16a in immediate proximity to the droplet discharge unit 24 by the driving of the wafer stage 5. As shown in FIG. 3B, the first gas controller 17a initiates supply of the gas 15 from the first supply outlet 16a when the target shot region 30 is positioned in the vicinity of the first supply outlet 16a, and the target shot region 30 is continuously moved to the pressing position. However, as shown in FIG. 3C, when the target shot region 30 is moved to the pressing position, neither the wafer 11 nor the auxiliary plate 19 are directly underneath the first supply outlet 16a during supply of the gas 15. Therefore, an interstice cannot be formed between the mold 8 and the wafer 11 from the point directly underneath the first supply outlet 16a to the pressing position, and intake of the gas 15 cannot be efficiently conducted in conjunction with movement of the target shot region 30. Thus, with the operations shown FIGS. 3A to 3C, it is difficult to raise gas concentration particularly in the vicinity of the pattern section 8a. Moreover, in the state shown in FIG. 3C, as large quantities of the gas 15 from the first supply outlet 16a leak to the outside of the wafer stage 5, the gas 15 penetrates, for example, the optical path of the laser interferometer 22 that measures the position of the wafer stage 5, raising the possibility that measurement values may be affected.

In this situation, in order to avoid an outflow of the gas 15 to the outside of the wafer stage 5 as shown in FIG. 3C, it would be conceivable, for example, to enlarge the surface area of the auxiliary plate 19 on the XY plane. By this means, no matter which target shot region 30 on the wafer 11 is moved to the pressing position, an interstice is always formed between the mold 8 and the wafer 11 (or the auxiliary plate 19), because the wafer 11 or the auxiliary plate 19 is directly underneath the first supply outlet 16a. However, enlargement of the auxiliary plate 19 necessarily performs control so as to enlargement of the entire imprint apparatus 1, thereby causing an increase in the footprint and the cost of the imprint apparatus 1. In the present embodiment, particularly in the case where the position of the target shot region 30 on the wafer 11 satisfies the condition of D1<=D2, the imprint apparatus 1 carries out operations like those shown in FIGS. 4A to 4D.

FIGS. 4A to 4D are drawings which show operations of the present embodiment for the case where the target shot region 30 is on the downstream side of the direction of movement on the wafer 11, and may be compared to the conventional operations shown in FIGS. 3A to 3C. Firstly, as shown in FIG. 4A, the target shot region 30 to which the resin 10 has been applied from the droplet discharge unit 24 is moved toward the first supply outlet 16a in immediate proximity to the droplet discharge unit 24 by the driving of the wafer stage 5. At this time, in the present embodiment, the first gas controller 17a does not initiate supply of the gas 15 from the first supply outlet 16a even when the target shot region 30 is positioned in the vicinity of the first supply outlet 16a. As shown in FIG. 4B, the target shot region 30 is then moved as is until it surpasses the second supply outlet 16b on the opposite side of the mold 8 that is interposed between the first supply outlet 16a and the second supply outlet 16b (preferably until it has slightly surpassed a position directly underneath the second supply outlet 16b), and is temporarily stopped at that position. Next, as shown in FIG. 4C, the direction of movement of the target shot region 30 is reversed by the driving of the wafer stage 5, and the target shot region 30 is moved toward the second supply outlet 16b that is in immediate proximity to the stop position. When the target shot region 30 is positioned in the vicinity of the second supply outlet 16b, the second gas controller 17b then initiates supply of the gas 15 from the second supply outlet 16b, and the target shot region 30 is continuously moved to the pressing position. As shown in FIG. 4D, the gas 15 supplied from the second supply outlet 16b is then drawn into the interstice between the mold 8 and the wafer 11 in conjunction with the movement of the wafer 11, efficiently raising gas concentration particularly in the vicinity of the pattern section 8a. Furthermore, the gas 15 supplied from the second supply outlet 16b can also be prevented from flowing out to the outside of the wafer stage 5.

Next, a description is given of the overall sequence of gas supply steps in the present embodiment from initiation to termination of supply of the gas 15 including the aforementioned operations after the application step in the present embodiment. FIG. 5 is a flowchart which shows the sequence of gas supply steps that are implemented from after the application step and that encompass the pattern formation step. Firstly, when the application step terminates, the controller 7 judges whether the position of the target shot region 30 on the wafer 11 satisfies any of the conditions pertaining to the relation of the aforementioned D1 and D2 (step S100). In this context, in the case where the controller 7 determines that the condition of D1>D2 is met as shown in FIGS. 2A to 2C, the target shot region 30 is next moved toward the first supply outlet 16a by the wafer stage 5 (step S101; see FIG. 2A). Next, when the target shot region 30 is positioned in the vicinity of the first supply outlet 16a, the controller 7 causes the first gas controller 17a to initiate supply of the gas 15 from the first supply outlet 16a (step S102; see FIG. 2B). The controller 7 now continuously causes the wafer stage 5 to move the target shot region 30 to the pressing position (step S103; see FIG. 2C). Next, the controller 7 performs control so as to transition to a series of pattern formation steps including a mold-pressing step, a curing step, and a mold-releasing step (step S104). After completing the pattern formation steps, the controller 7 then causes the first gas controller 17a to terminate supply of the gas 15 from the first supply outlet 16a (step S105), and transitions to a subsequent step such as a step in which it is judged whether there is a target shot region 30 on the wafer 11 that is to be treated next.

On the other hand, in the case where the controller 7 determines in step S100 that a condition of D1<=D2 is satisfied as shown in FIGS. 4A to 4D, the target shot region 30 is moved toward the second supply outlet 16b (step S106; see FIG. 4A). The controller 7 then causes a temporary stoppage at the point where the position of the target shot region 30 surpasses the second supply outlet 16b (see FIG. 4B). Next, the controller 7 performs control so as to reverse the direction of movement by the driving of the wafer stage 5, and to move the target shot region 30 toward the second supply outlet 16b that is in immediate proximity to the stop position (step S107). Next, when the target shot region 30 is positioned in the vicinity of the second supply outlet 16b, the controller 7 causes the second gas controller 17b to initiate supply of the gas 15 from the second supply outlet 16b (step S108; see FIG. 4C). The controller 7 continuously performs control so as to move the target shot region 30 to the pressing position by the wafer stage 5 (step S109; see FIG. 4D). Next, as in step S104, the controller 7 performs control so as to transition to a series of pattern formation steps including a mold-pressing step, a curing step, and a mold-releasing step (step S110). After completion of the pattern formation steps, the controller 7 then causes the second gas controller 17b to terminate supply of the gas 15 from the second supply outlet 16b (step S111), and performs control so as to transition to a subsequent step such as a step in which it is judged whether there is a target shot region 30 on the wafer 11 that is to be treated next.

In this manner, with the imprint apparatus 1, gas is supplied to the interstice between the mold 8 and the wafer 11 by the gas supply mechanism 4 during pressing of the mold 8 against the resin 10 on the wafer 11 in order to inhibit occurrence of unfilled portions in the resin pattern formed on the wafer. During this time, the gas concentration can be efficiently raised in a shorter time regardless of the position of the target shot position 30 on the wafer 11, because the interstice can be maintained as described above. For example, even if an operation is included for changing (reversing) the direction of movement of the target shot region 30 as with the operations shown in FIGS. 4A to 4D, the movement time is quite short compared to the conventional filling time (as stated above, from one second to several tens of seconds or more). Therefore, the imprint apparatus 1 can improve productivity (throughput). Furthermore, with this imprint apparatus 1, the wafer stage 5 can remain compact, and enlargement of the overall apparatus can be inhibited, because there is no need to enlarge the auxiliary plate 19 in order to maintain the interstice.

According to the present embodiment as described above, it is possible to provide an imprint apparatus which is advantageous for increasing efficiency when inhibiting occurrence of unfilled portions in a contoured pattern of a mold, and which prevents enlargement of the wafer stage on which a wafer is mounted.

(Second Embodiment)

Next, the imprint apparatus of a second embodiment of the present invention is described. In the first embodiment, the imprint apparatus 1 carries out a one-time imprint processing with respect to a single target shot region 30, and the imprint processing is repeated for the multiple shot regions present on the wafer 11. In contrast, a feature of the imprint apparatus of the present embodiment is that a one-time imprint processing is carried out with respect to multiple target shot regions 30. That is, the imprint apparatus of the present embodiment carries out imprint processing with respect to multiple target shot regions 30 while conducting a one-time supply of gas by the gas supply mechanism 4. In this situation, as the number of single target shot regions 30 in the first embodiment is one, the position of the target shot region 30 on the wafer 11 could be considered in terms of satisfying the two conditions of D1>D2 and D1<=D2 if the respective distances D1 and D2 are used in the same manner described above. In contrast, as there is a plural number of single target shot regions 30 in the present embodiment, the position of the target shot regions 30 on the wafer 11 must be considered in terms of satisfying the following three conditions. That is, the first condition is the case where all of the multiple target shot regions 30 satisfy the condition of D1>D2. The second condition is the case where all of the multiple target shot regions 30 satisfy the condition of D1<=D2. Furthermore, as the condition peculiar to the present embodiment, the third condition is the case of commingling where some of the multiple target shot regions 30 satisfy the condition of D1>D2, and some satisfy the condition of D1<=D2. Each of these three conditions is described below.

For purposes of comparison, the respective drawings from FIG. 6A to FIG. 8A correspond to the explanatory drawings shown from FIG. 2A to FIG. 4D, and are drawings which serve to explain, in the respective chronological sequence, the operations of the imprint apparatus 1 of the present embodiment after the resin 10 has been applied onto two adjacent target shot regions 30a and 30b (after the application step). Otherwise, as the configuration of the imprint apparatus of the present embodiment is identical to that of the imprint apparatus 1 of the first embodiment, the same reference numerals are assigned to the respective components, and description thereof is omitted. In each of these drawings, the two target shot regions 30a and 30b on the wafer 11 are exemplary, and the number of single target shot regions 30 is not limited thereto.

FIGS. 6A to 6F are drawings which show operations for the case where the positions of all of the target shot regions 30a and 30b on the wafer 11 satisfy the condition of D1>D2, i.e., the first condition. Firstly, as shown in FIG. 6A, the target shot regions 30a and 30b to which the resin 10 has been successively applied from the droplet discharge unit 24 are moved toward the first supply outlet 16a in immediate proximity to the droplet discharge unit 24 by the driving of the wafer stage 5. Next, as shown in FIG. 6B, when the target shot region 30a (the target shot region that is positioned closest to the pattern section 8a at the time when movement begins) is positioned in the vicinity of the first supply outlet 16a, the first gas controller 17a initiates supply of the gas 15 for the first supply outlet 16a. As shown in FIG. 6C, the target shot regions 30a and 30b then continue to be moved toward the pressing position, and are stopped at the point when the target shot region 30a reaches the pressing position. In this case, as well, the gas 15 supplied from the first supply outlet 16a is drawn into the interstice between the mold 8 and the wafer 11 in conjunction with the movement of the wafer 11, efficiently raising gas concentration particularly in the vicinity of the pattern section 8a. Next, as shown in FIG. 6D, the mold-pressing step and the curing step are carried out with respect to the target shot region 30a, after which the mold-releasing step is carried out, as shown in FIG. 6E. After the neighboring target shot region 30b is next moved to the pressing position by the wafer stage 5, as shown in FIG. 6F, it is also subjected to the mold-pressing step, curing step, and mold-releasing step. When pattern formation is completed on all target shot regions 30 to which the resin 10 has been applied on this occasion, the next multiple target shot regions 30 that are to be subjected to imprint processing are sequentially moved to a position directly underneath the droplet discharge unit 24. In this manner, with respect to operations for the case where the first condition is satisfied, the wafer 11 or the auxiliary plate 19 is constantly in opposition directly underneath the first supply outlet 16a during supply of the gas 15, until pattern formation is completed on all target shot regions 30 to which the resin 10 has been successively applied. Therefore, with the operations shown in FIGS. 6A to 6F, an interstice is maintained between the mold 8 and the wafer 11 from a position directly underneath the first supply outlet 16a until a position directly underneath the pressing position.

Next, FIGS. 7A to 7G are drawings which show operations for the case where the positions of all of the target shot regions 30a and 30b on the wafer 11 satisfy the condition of D1<=D2, i.e., the second condition. Firstly, as shown in FIG. 7A, the target shot regions 30a and 30b to which the resin 10 has been successively applied from the droplet discharge unit 24 are moved toward the first supply outlet 16a in immediate proximity to the droplet discharge unit 24 by the driving of the wafer stage 5. At this time, the first gas controller 17a does not initiate supply of the gas 15 from the first supply outlet 16a even when either of the target shot regions 30a and 30b is positioned in the vicinity of the first supply outlet 16a. As shown in FIG. 7B, the target shot regions 30a and 30b are moved as is until they surpass the second supply outlet 16b on the opposite side of the mold 8 that is interposed between the first supply outlet 16a and the second supply outlet 16b (preferably until they have slightly surpassed a position directly underneath the second supply outlet 16b), and are temporarily stopped at that position. Next, as shown in FIG. 7C, the direction of movement of the target shot regions 30a and 30b is reversed by the driving of the wafer stage 5, and the target shot regions 30a and 30b are moved toward the second supply outlet 16b that is in immediate proximity to the stop position. When the target shot region 30b (the target shot region that is located farthest from the pattern section 8a at the time when movement is initiated) is positioned in the vicinity of the second supply outlet 16b, the second gas controller 17b then initiates supply of the gas 15 from the second supply outlet 16b. As shown in FIG. 7D, the target shot regions 30a and 30b are then continuously moved toward the pressing position, and are stopped when the target shot region 30b reaches the pressing position. In this case, as well, the gas 15 supplied from the second supply outlet 16b is then drawn into the interstice between the mold 8 and the wafer 11 in conjunction with the movement of the wafer 11, efficiently raising gas concentration particularly in the vicinity of the pattern section 8a. Next, as shown in FIG. 7E, the mold-pressing step and the curing step are carried out with respect to the target shot region 30b, after which, as shown in FIG. 7F, the mold-releasing step is carried out. The neighboring target shot region 30a is then also continuously moved to the pressing position by the wafer stage 5, as shown at FIG. 7G, after which the mold-pressing step, the curing step, and the mold-releasing step are carried out. Here, as well, upon completion of pattern formation on all of the target shot regions 30 to which the resin 10 has been applied on this occasion, the next multiple target shot regions 30 that are to be subjected to imprint processing are sequentially moved to a position directly underneath the droplet discharge unit 24. In this manner, with respect also to operations for the case where the second condition is satisfied, the wafer 11 or the auxiliary plate 19 is constantly in opposition directly underneath the first supply outlet 16b during supply of the gas 15, until pattern formation is completed on all target shot regions 30 to which the resin 10 has been successively applied. Therefore, with the operations shown in FIGS. 7A to 7G, an interstice is maintained between the mold 8 and the wafer 11 from a position directly underneath the second supply outlet 16b until a position directly underneath the pressing position.

Furthermore, FIGS. 8A to 8H are drawings which show operations for the case where the position of the target shot region 30a among all of the target shot regions 30a and 30b on the wafer 11 satisfies the condition of D1>D2, while the position of the target shot region 30b satisfies the condition of D1 (D1b)<=D2, i.e., the third condition. Firstly, as shown in FIG. 8A, the target shot regions 30a and 30b to which the resin 10 has been successively applied from the droplet discharge unit 24 are moved toward the first supply outlet 16a in immediate proximity to the droplet discharge unit 24 by the driving of the wafer stage 5. Next, as shown in FIG. 8B, when the target shot region 30a is positioned in the vicinity of the first supply outlet 16a, the first gas controller 17a initiates supply of the gas 15 from the first supply outlet 16a. As shown in FIG. 8C, the target shot regions 30a and 30b are then continuously moved toward the pressing position, and are stopped when the target shot region 30a among these reaches the pressing position. In this case, as well, the gas 15 supplied from the first supply outlet 16a is then drawn into the interstice between the mold 8 and the wafer 11 in conjunction with the movement of the wafer 11, efficiently raising gas concentration particularly in the vicinity of the pattern section 8a. Here, as shown in FIG. 8D, the mold-pressing step and the curing step are carried out with respect to the target shot region 30a, after which, as shown in FIG. 8E, the mold-releasing step is carried out. Otherwise, in the case where the number of single target shot regions 30 is three or more, and where the position of another target shot region among these other than the target shot region 30a satisfies the condition of D1>D2, it is moved as is to the pressing position by the driving of the wafer stage 5, and pattern formation is continuously conducted, as in the example shown in FIGS. 6A to 6F. Next, upon completion of pattern formation on the target shot region 30a, the first gas controller 17a stops supply of the gas 15 from the first supply outlet 16a, as shown in FIG. 8F. The target shot regions 30a and 30b are then moved as is until they surpass the second supply outlet 16b on the opposite side of the mold 8 that is interposed between the first supply outlet 16a and the second supply outlet 16b (preferably until they have slightly surpassed a position directly underneath the second supply outlet 16b), and are temporarily stopped at that position. Next, as shown in FIG. 8G, the direction of movement of the target shot regions 30a and 30b is reversed by the driving of the wafer stage 5, and the target shot regions 30a and 30b are moved toward the second supply outlet 16b that is in immediate proximity to the stop position. When the target shot region 30b is positioned in the vicinity of the second supply outlet 16b, the second gas controller 17b then initiates supply of the gas 15 from the second supply outlet 16b. As shown in FIG. 8H, the target shot regions 30a and 30b are then continuously moved toward the pressing position, and are stopped when the target shot region 30b reaches the pressing position. In this case, as well, the gas 15 supplied from the second supply outlet 16b is then drawn into the interstice between the mold 8 and the wafer 11 in conjunction with the movement of the wafer 11, efficiently raising gas concentration particularly in the vicinity of the pattern section 8a. The neighboring target shot region 30a is then also continuously moved to the pressing position by the wafer stage 5, after which the mold-pressing step, the curing step, and the mold-releasing step are carried out. Here, as well, upon completion of pattern formation on all of the target shot regions 30 to which the resin 10 has been applied on this occasion, the next multiple target shot regions 30 that are to be subjected to imprint processing are sequentially moved to a position directly underneath the droplet discharge unit 24. In this manner, with respect also to operations for the case where the third condition is satisfied, the wafer 11 or the auxiliary plate 19 is constantly in opposition directly underneath the first supply outlet 16a during supply of the gas 15, until pattern formation is completed on all target shot regions 30 to which the resin 10 has been successively applied. Therefore, with the operations shown in FIGS. 8A to 8H, an interstice is maintained between the mold 8 and the wafer 11 from a position directly underneath either the first supply outlet 16a or the second supply outlet 16b until a position directly underneath the pressing position.

Next, a description is given of the overall sequence of the gas supply process from initiation to termination of supply of the gas 15 including the aforementioned operations after the application step in the present embodiment. FIG. 9 is a flowchart which shows the sequence of gas supply steps that are implemented from after the application step and that encompass the pattern formation step in the present embodiment. First, when the application step terminates with respect to the multiple (two) target shot regions 30a and 30b on the wafer 11, the controller 7 judges whether the positions of the respective target shot regions 30a and 30b satisfy any of the conditions pertaining to the relation of the aforementioned D1 and D2 (step S200). In this context, in the case where the controller 7 determines that the positions of the respective target shot regions 30a and 30b satisfy the condition of D1>D2 as shown in FIGS. 6A to 6F, the process advances to the following step S201. Firstly, the controller 7 performs control so as to move the target shot regions 30a and 30b toward the first supply outlet 16a by the wafer stage 5 (step S201; see FIG. 6A). Next, when the target shot region 30a that is to be treated first is positioned in the vicinity of the first supply outlet 16a, the controller 7 causes the first gas controller 17a to initiate supply of the gas 15 from the first supply outlet 16a (step S202; see FIG. 6B). The controller 7 now continuously performs control so as to move the target shot region 30a to the pressing position by the wafer stage 5 (step S203; see FIG. 6C). Next, the controller 7 performs control so as to transition to the series of pattern formation steps including the mold-pressing step, the curing step, and the mold-releasing step (step S204; see FIG. 6D and FIG. 6E). Furthermore, the controller 7 continuously performs control so as to move the target shot region 30b that is next to be treated to the pressing position by the wafer stage 5 (step S205; see FIG. 6F), where the mold-pressing step, the curing step, and the mold-releasing step are carried out (step S206). Next, the controller 7 judges whether or not pattern formation has been completed with respect to all of the target shot regions 30a and 30b of this occasion (step S207). In this context, in the case where the number of target shot regions 30 is three or more, as there also exists another region in addition to the target regions 30a and 30b where a pattern has not been formed, a 'No' is rendered, and the controller 7 performs control so as to return to step S205 where pattern formation is carried out with respect to the remaining target shot region. On the other hand, in the case where it is determined that pattern formation has been completed on all of the target shot regions 30a and 30b ('Yes'), the controller 7 causes the first controller 17a to terminate supply of the gas 15 from the first supply outlet 16a (step S208). The controller 7 then performs control so as to transition to a subsequent step such as a step in which it is judged whether there are multiple target shot regions (a target shot region group) on the wafer 11 that are to be treated next.

Next, in the case where the controller 7 determines in step S200 that the positions of the respective target shot regions 30a and 30b satisfy the condition of D1<=D2 as shown in FIGS. 7A to 7G, the process transitions to the following step S209. First, the controller 7 performs control so as to move the target shot regions 30a and 30b toward the second supply outlet 16b by the wafer stage 5 (step S209; see FIG. 7A). The controller 7 then causes a temporary stoppage at the point where the position of the target shot region 30b surpasses the second supply outlet 16b (see FIG. 7B). Next, the controller 7 performs control so as to reverse the direction of movement by the driving of the wafer stage 5, and to move the target shot regions 30a and 30b toward the second supply outlet 16b that is in immediate proximity to the stop position (step S210). Next, when the target shot region 30b that is to be treated first is positioned in the vicinity of the second supply outlet 16b, the controller 7 causes the second gas controller 17b to initiate supply of the gas 15 from the second supply outlet 16b (step S211; see FIG. 7C). The controller 7 now continuously performs control so as to move the target shot region 30b to the pressing position by the wafer stage 5 (step S212; see FIG. 7D). Next, the controller 7 performs control so as to transition to the series of pattern formation steps including the mold-pressing step, the curing step, and the mold-releasing step (step S213; see FIG. 7E and FIG. 7F). Furthermore, the controller 7 continuously performs control so as to move the target shot region 30a that is to be treated next to the pressing position by the wafer stage 5 (step S214; see FIG. 7G), where the mold-pressing step, curing step, and mold-releasing step are carried out (step S215). Next, the controller 7 judges whether or not pattern formation has been completed on all of the target shot regions 30a and 30b of this occasion (step S216). In this context, in the case where the number of target shot regions 30 is three or more, as there also exists another region in addition to the target regions 30a and 30b where a pattern has not been formed, a 'No' is rendered, and the controller 7 performs control so as to return to step S214 where pattern formation is carried out with respect to the remaining target shot region. On the other hand, in the case where it is determined that pattern formation has been completed on all of the target shot regions 30a and 30b ('Yes'), the controller 7 causes the second controller 17b to terminate supply of the gas 15 from the second supply outlet 16b (step S217). In this case, as well, the controller 7 then performs control so as to transition to a subsequent step such as a step in which it is judged whether there are multiple target shot regions (a target shot region group) on the wafer 11 that are to be treated next.

Furthermore, in the case where the controller 7 determines in step S200 with respect to the respective target shot regions 30a and 30b that there is a mixed state in which one satisfies the condition of D1>D2, and one satisfies the condition of D1<=D2 as shown in FIGS. 8A to 8H, the process transitions to the following step S218. FIG. 10 is a flow chart which extracts in particular the steps from step 218 onward from among the steps in the flowchart of FIG. 9. Referencing FIGS. 8A to 8H, it is here assumed with respect to the two target shot regions 30a and 30b that the position of the target shot region 30a satisfies the condition of D1 (D1 a)>D2, and that the position of the target shot region 30b satisfies the condition of D1 (D1b)<=D2. Firstly, the controller 7 performs control so as to move the target shot regions 30a and 30b toward the first supply outlet 16a by the wafer stage 5 (step S218; see FIG. 8A). Next, when the target shot region 30a that satisfies the condition of D1>D2 is positioned in the vicinity of the first supply outlet 16a, the controller 7 causes the first gas controller 17a to initiate supply of the gas 15 from the first supply outlet 16a (step S219; see FIG. 8B). The controller 7 now continuously performs control so as to move the target shot region 30a to the pressing position by the wafer stage 5 (step S220; see FIG. 8C). Next, the controller 7 performs control so as to transition to the series of pattern formation steps including the mold-pressing step, the curing step, and the mold-releasing step (step S221; see FIG. 8D and FIG. 8E). Next, the controller 7 judges with respect to all of the target shot regions 30 whether pattern formation has been completed on target shot regions that satisfy the condition of D1>D2 other than the target short region 30a (step S222). That is, although the target shot region 30a is the only one that satisfies the condition of D1>D2 when considered in terms of the example shown in FIGS. 8A to 8H, in the case where the number of target shot regions 30 is three or more, it may be that there is also a target shot region other than the target shot region 30a where pattern formation has not been conducted. In such a case ('No'), the controller 7 performs control so as to return to step S220, where pattern formation is carried out with respect to the remaining target shot region. On the other hand, in the case where it is determined that pattern formation has been completed on all of the target shot regions 30 that satisfy the condition of D1>D2 ('Yes'), the controller 7 causes the first gas controller 17a to terminate supply of the gas 15 from the first supply outlet 16a (step S223).

Subsequently, the controller 7 performs control so as to move the target shot regions 30a and 30b toward the second supply outlet 16b by the wafer stage 5 (step S224; see FIG. 8F). The controller 7 then causes a temporary stoppage at the point where the position of the target shot region 30b surpasses the second supply outlet 16b. Next, the controller 7 performs control so as to reverse the direction of movement by the driving of the wafer stage 5, and to move the target shot regions 30a and 30b toward the second supply outlet 16b that is in immediate proximity to the stop position (step S225). Next, when the target shot region 30b that is to be treated next is positioned in the vicinity of the second supply outlet 16b, the controller 7 causes the second gas controller 17b to initiate supply of the gas 15 from the second supply outlet 16b (step S226; see FIG. 8G). The controller 7 now continuously performs control so as to move the target shot region 30b to the pressing position by the wafer stage 5 (step S227; see FIG. 8H). Next, the controller 7 performs control so as to transition to the series of pattern formation steps including the mold-pressing step, the curing step, and the mold-releasing step (step S228). Next, the controller 7 judges whether or not pattern formation has been completed on all of the target shot regions 30a and 30b of this occasion (step S216). Next, the controller 7 judges with respect to all of the target shot regions 30 whether pattern formation has been completed on target shot regions that satisfy the condition of D1<=D2 other than the target short region 30b (step S229). Here also, although the target shot region 30b is the only one that satisfies the condition of D1<=D2 when considered in terms of the example shown in FIGS. 8A to 8H, in the case where the number of target shot regions 30 is three or more, it may be that there is also a target shot region other than the target shot region 30b where pattern formation has not been conducted. In such a case ('No'), the controller 7 performs control so as to return to step S227, where pattern formation is carried out with respect to the remaining target shot region. On the other hand, in the case where it is determined that pattern formation has been completed on all of the target shot regions 30 that satisfy the condition of D1<=D2 ('Yes'), the controller 7 causes the second gas controller 17b to terminate supply of the gas 15 from the second supply outlet 16b (step S230). In this case, as well, the controller 7 then performs control so as to transition to a subsequent step such as a step in which it is judged whether there are multiple target shot regions (a target shot region group) on the wafer 11 that are to be treated next.

In this manner, according to the present embodiment, patterns can be continuously formed on multiple target shot regions 30 on the wafer 11 during a single supply of gas. That is, as movement of the target shot regions 30 between a position directly underneath the droplet discharge unit 24 that is the application position and a position directly underneath the pattern section 8a that is the pressing position is greatly reduced, the imprint apparatus 1 can exhibit the same effects as in the first embodiment, and can further enhance productivity.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When another article such as a patterned medium (storage medium), an optical element, or the like is manufactured, the manufacturing method may include another step of processing the substrate on which a pattern has been formed instead of the etching step. The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-039813 filed Feb. 27, 2012, which is hereby incorporated by reference herein in its entirety.

The invention claimed is:

1. An imprint apparatus which molds and cures an uncured resin on a substrate with a mold, and which forms a cured resin pattern on the substrate, the imprint apparatus comprising:
    an application unit configured to apply the uncured resin to a shot region on the substrate;
    a substrate holding unit configured to hold and move the substrate, the substrate holding unit including an auxiliary plate disposed at a periphery of the substrate and having a surface height aligned with that of the substrate;
    a gas supply unit including multiple supply outlets, the gas supply unit being configured to supply a gas to an interstice between the mold and the substrate; and
    a controller configured to select a supply outlet, among the multiple supply outlets, to supply the gas so that the selected supply outlet is opposed by either the substrate or the auxiliary plate from when the selected supply outlet initially supplies the gas for the shot region with the uncured resin until the shot region with the uncured resin is moved to a pressing position where pressing of the uncured resin is conducted and to perform control so as to switch supply outlets that supply the gas and a direction of movement of the shot region based on conditions related to a position of the shot region that is subject to the pressing.

2. The imprint apparatus according to claim 1, wherein:
    the multiple supply outlets include a first supply outlet disposed between an application position of the application unit and the pressing position along the direction of movement of the shot region; and
    the conditions relate to a first distance from a trailing edge of the auxiliary plate to the shot region and a second distance from the pressing position where pressing of the uncured resin is conducted to the first supply outlet.

3. The imprint apparatus according to claim 2, wherein the controller is further configured to perform control so as to supply the gas by the first supply outlet when the shot region with the uncured resin is moved to the pressing position, in a case where the first distance is larger than the second distance.

4. The imprint apparatus according to claim 2, wherein the controller is further configured to perform control so as to supply the gas by a second supply outlet among the multiple supply outlets when the shot region with the uncured resin is moved beyond a supply position of the second supply outlet, the direction of movement of the shot region is subsequently reversed, and the shot region is moved to the pressing position, in a case where the first distance is equal to or less than the second distance.

5. The imprint apparatus according to claim 1, wherein the controller is further configured to cause the application unit to apply the uncured resin to a plurality of the shot regions on the substrate, and to cause pressing to be continuously performed on the plurality of shot regions while the gas is supplied to the interstice.

6. An imprint method which molds and cures uncured resin on a substrate with a mold, and which forms a pattern in the cured resin on the substrate, the imprint method comprising:
    applying the uncured resin to a shot region on the substrate;
    supplying a gas to an interstice between the mold and the substrate, in conjunction with movement of the shot region from a position where the uncured resin was applied to a pressing position where the mold is pressed against the uncured resin that was applied to the shot region; and
    selecting a supply outlet that supplies the gas so that either the substrate, or an auxiliary plate disposed at the periphery of the substrate so as to align surface height with the pertinent substrate, opposes the supply outlet that supplies the gas among multiple supply outlets capable of supplying the gas, and the direction of movement of the shot region is controlled.

7. An article manufacturing method, comprising:
    forming a imprint material pattern on a substrate using the imprint apparatus according to claim 1; and
    processing the substrate on which a pattern was formed in the forming.

8. An article manufacturing method, comprising:
    forming a imprint material pattern on a substrate using the imprint apparatus according to claim 6; and
    processing the substrate on which a pattern was formed in the forming.

9. An imprint apparatus which molds and cures an uncured resin on a substrate with a mold, and which forms a cured resin pattern on the substrate, the imprint apparatus comprising:
    an application unit configured to apply the uncured resin to a shot region on the substrate;
    a substrate holding unit configured to hold and move the substrate, the substrate holding unit including an auxiliary plate disposed at a periphery of the substrate and having a surface height aligned with that of the substrate;
    a gas supply unit including multiple supply outlets, the gas supply unit being configured to supply a gas to an interstice between the mold and the substrate; and
    a controller configured to select a supply outlet, among the multiple supply outlets, to supply the gas and to control a direction of movement of the shot region based on a relation between a first distance and a second distance, the first distance being a distance from a trailing edge of the auxiliary plate to the shot region, and the second distance being a distance from a pressing position where pressing of the uncured resin is conducted to a first supply outlet,
    wherein the multiple supply outlets include the first supply outlet, which is disposed between an application position of the uncured resin and the pressing position, and a second supply outlet disposed on an opposite side of the mold from the first supply outlet.

10. The imprint apparatus according to claim 9, wherein the relation is a magnification relation between the first distance and the second distance.

11. An article manufacturing method, comprising:
    forming an imprint material pattern on a substrate using the imprint apparatus according to claim 9; and
    processing the substrate on which a pattern was formed in the forming.

* * * * *